(12) United States Patent
Lauffenburger et al.

(10) Patent No.: US 6,657,487 B2
(45) Date of Patent: Dec. 2, 2003

(54) PHOTODETECTOR PREAMPLIFIER CIRCUIT HAVING A ROTATING INPUT STAGE

(75) Inventors: James Harold Lauffenburger, Colorado Springs, CO (US); Kevin Scott Buescher, Colorado Springs, CO (US)

(73) Assignee: EM(US) Design, Inc, Colorado Springs, CO (US)

( * ) Notice: Subject to any disclaimer, the term of this patent is extended or adjusted under 35 U.S.C. 154(b) by 0 days.

(21) Appl. No.: 09/777,256

(22) Filed: Feb. 5, 2001

(65) Prior Publication Data

US 2002/0113645 A1 Aug. 22, 2002

(51) Int. Cl.⁷ .................................................. H03F 1/02
(52) U.S. Cl. ........................ 330/9; 330/51; 330/124 R
(58) Field of Search ......................... 330/9, 51, 124 R, 330/309, 295; 250/214 A, 214 AS; 327/124

(56) References Cited

U.S. PATENT DOCUMENTS

| | | | | |
|---|---|---|---|---|
| 3,454,886 A | * | 7/1969 | Bijl et al. ......................... 330/9 |
| 4,242,730 A | * | 12/1980 | Golias et al. ................. 364/416 |
| 4,547,683 A | * | 10/1985 | Bingham ...................... 307/355 |
| 5,233,180 A | * | 8/1993 | Tsuruta et al. ............ 250/208.1 |
| 5,977,828 A | | 11/1999 | Hu et al. ...................... 330/254 |
| 6,040,732 A | | 3/2000 | Brokaw ........................ 327/408 |
| 6,140,872 A | | 10/2000 | McEldowney .................. 330/9 |
| 6,340,903 B1 | * | 1/2002 | Leith ............................ 327/94 |
| 6,377,200 B1 | * | 4/2002 | Lee ............................. 341/155 |

FOREIGN PATENT DOCUMENTS

| | | | |
|---|---|---|---|
| EP | 0786899 A | 7/1997 | .......... H04N/5/217 |
| EP | 2001292051 | 10/2001 | |

* cited by examiner

Primary Examiner—Henry Choe
(74) Attorney, Agent, or Firm—Law Office of Dale B. Halling

(57) ABSTRACT

An amplifier circuit (10) having a rotating input stage has a switching network (12) connected to an input (14). A number of parallel transconductance gain stages (16) are connected to the switching network (12). An auto-zeroing circuit (18) is connected to the switching network (12). A second transconductance gain stage (20) is connected to the parallel transconductance gain stages (16).

14 Claims, 4 Drawing Sheets

US 6,657,487 B2

PHOTODETECTOR PREAMPLIFIER CIRCUIT HAVING A ROTATING INPUT STAGE

FIELD OF THE INVENTION

The present invention relates generally to the field of electronic circuits and more particularly to a photodetector preamplifier circuit having a "rotating" input stage.

BACKGROUND OF THE INVENTION

There are a number optical storage standards such as CD (compact disks), DVD (digital video disks), CD-RW (Write/Read CDs), etc. All of these products require photodetector preamplifiers to sense and amplify the reflection from the disks.

There is a trend to build a single machine that can read all of the different standards. Each of these different standards have different amounts of reflectance of the interrogating laser. Thus, a preamplifier circuit designed for one standard is not optimum for a second standard. This can result in misread bits and degrade the performance of the optical storage system. Generally, a preamplifier with adjustable gain is desirable for best performance.

However, the photodetector/preamplifier circuit has a number of other important constraints that make adjustable gain more difficult. The main other constraints include: low-noise amplification, wide signal bandwidth, DC accuracy, relatively large photodetector size, high responsivity, and low cost. These other constraints increase the challenge of providing adjustable gain.

This problem can be demonstrated by an example. A typical photodetector preamplifier circuit is shown in FIG. 1. The photodetector is represented by the current source 14 and the capacitor Cpd, 16. The preamplifier, 10, is represented in its simplest form by the amplifier symbol and the feedback resistor Rf. The gain of the preamplifier is approximately set by the resistor Rf; which converts the input photocurrent to an output voltage, where this conversion factor is called the transimpedance gain. The bandwidth is set by the amplifier characteristics and by the capacitance of the photodiode (plus other parasitic capacitances). The amplifier, plus the resistor RF and the photodetector capacitance Cpd form a feedback loop. This loop is potentially unstable, and the standard stability criteria and calculations (Nyquist, Bode, etc) must be used to guarantee stability over all process, temperature and other production variations. The dominant pole in the loops is usually created by the time constant of the feedback resistor and the photodetector capacitance. In order to achieve the low noise objective, the feedback resistor must be large. In order to achieve wide bandwidth, the amplifier gain must be large enough to move the dominant pole to a high frequency in the closed loop. And, to achieve DC accuracy, the amplifier gain must be quite high at low frequency.

Normally, to achieve DC accuracy and high gain, an amplifier will be constructed in the standard industry practice of an input differential stage, followed by a high gain $2^{nd}$ stage and then frequency-compensated by "Miller" a feedback capacitor across the $2^{nd}$ stage. This produces a standard operational amplifier with DC accuracy, high gain, and possibly wide closed-loop bandwidth. However, using this in a photodetector preamplifier will lead to either reduced bandwidth or to instability. The dominant pole of the operational amplifier, combined with the dominant pole of the Rf, Cpd will result in a $2^{nd}$ order loop. If additional poles and time delays are introduced (as a result of parasitics or other portions of the amplifier), then the result is an oscillator.

The normal methods to reduce this oscillation are: 1) reduce the bandwidth of the amplifier so that it is the dominant pole of the system; 2) reducing the size of Rf to increase the frequency of the Rf Cpd pole; 3) compensate Rf by placing a capacitor in parallel with it; and/or 4) compensate Cpd by placing a resistor in series with it. These solutions all result in sub-optimal preamplifiers; 1 and 2 result in much lower bandwidth, while 3 and 4 result in much higher noise levels.

These problems are made much more difficult when the feedback resistor, Rf needs to be variable. Then, any of these compensation methods is more difficult due to the multiple criteria that must be simultaneously optimized.

Another practical difficulty in implementing very wide bandwidth preamplifiers is the trade-off between DC accuracy and bandwidth. This trade-off occurs in 2 main ways: 1) in the location of the dominant poles of the amplifiers; and 2) in the physical size of the components of the amplifier. The first part of the trade-off has been described above, but the $2^{nd}$ requires a bit more explanation. In order to created extremely wide bandwidth amplifiers, any parasitic capacitances must be reduced to a minimum. These parasitic capacitances are simply the result of physical dimensions of components, so it is important to use very small transistors throughout the amplifier. However, it is a well-established fact that mis-match between transistors is reduced if the transistors are made much larger than the minimum allowed by the process technology in use. If "minimum size" transistors are used, then the mis-match is large.

The input stage of an amplifier generally consists of a differential pair to measure the input differential voltage, and amplify it. If the transistors are mis-matched, then a 0 differential voltage could appear as if there was a signal present; or an input signal can be partially or fully cancelled by the mis-match of the transistors.

Thus, it is difficult to simultaneously optimize the DC accuracy of an amplifier and also achieve maximum bandwidth. This problem is made worse due to the stability constraints of a photodetector preamplifier, and it is difficult to meet all the criteria of performance in a low-cost manufacturing process.

It is the object of this present invention to provide: a) an amplifier topology that allows for optimum dynamic range, bandwidth, transimpedance gain, signal to noise ratio, and DC accuracy; b) a means of allowing the transimpedance gain to be varied while the other criteria are optimized, and c) an improved DC accuracy for the input stage of this amplifier.

DETAILED DESCRIPTION OF THE DRAWINGS

An amplifier circuit having a rotating front end has a switching network connected to an input. A number of parallel transconductance gain stages are connected to the switching network. An auto-zeroing circuit is connected to the switching network. A second transconductance gain stage is connected to the parallel transconductance gain stages. The parallel transconductance gain stages provide high bandwidth and large gain values. The auto-zeroing circuit provides a DC offset adjustment.

Figure 1:
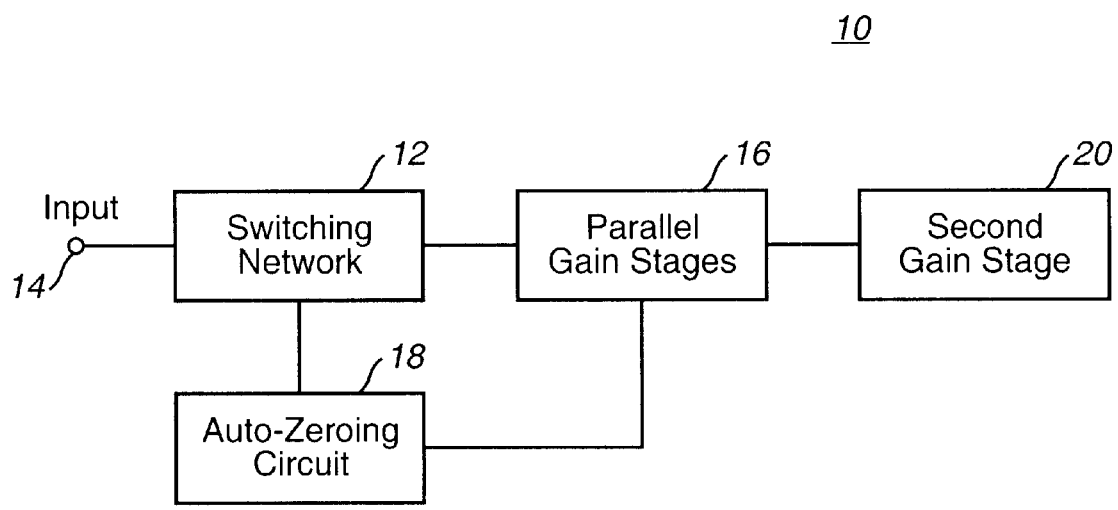
FIG. 1 is a block diagram of an amplifier circuit having a rotating front end in accordance with one embodiment of the invention.

FIG. 1 is a block diagram of an amplifier circuit 10 having a rotating front end in accordance with one embodiment of the invention. The amplifier circuit 10 has a switching network 12 connected to an input 14. In one embodiment, the input is connected to a photo-detector. A plurality of parallel gain stages 16 are connected to the switching network 12. An auto-zeroing circuit 18 is connected to the switching network 12. A second gain stage 20 is connected to the plurality of parallel gain stages 16. The switching network 12 and the plurality of parallel gain stages 16 form the rotating front end.

Figure 2:
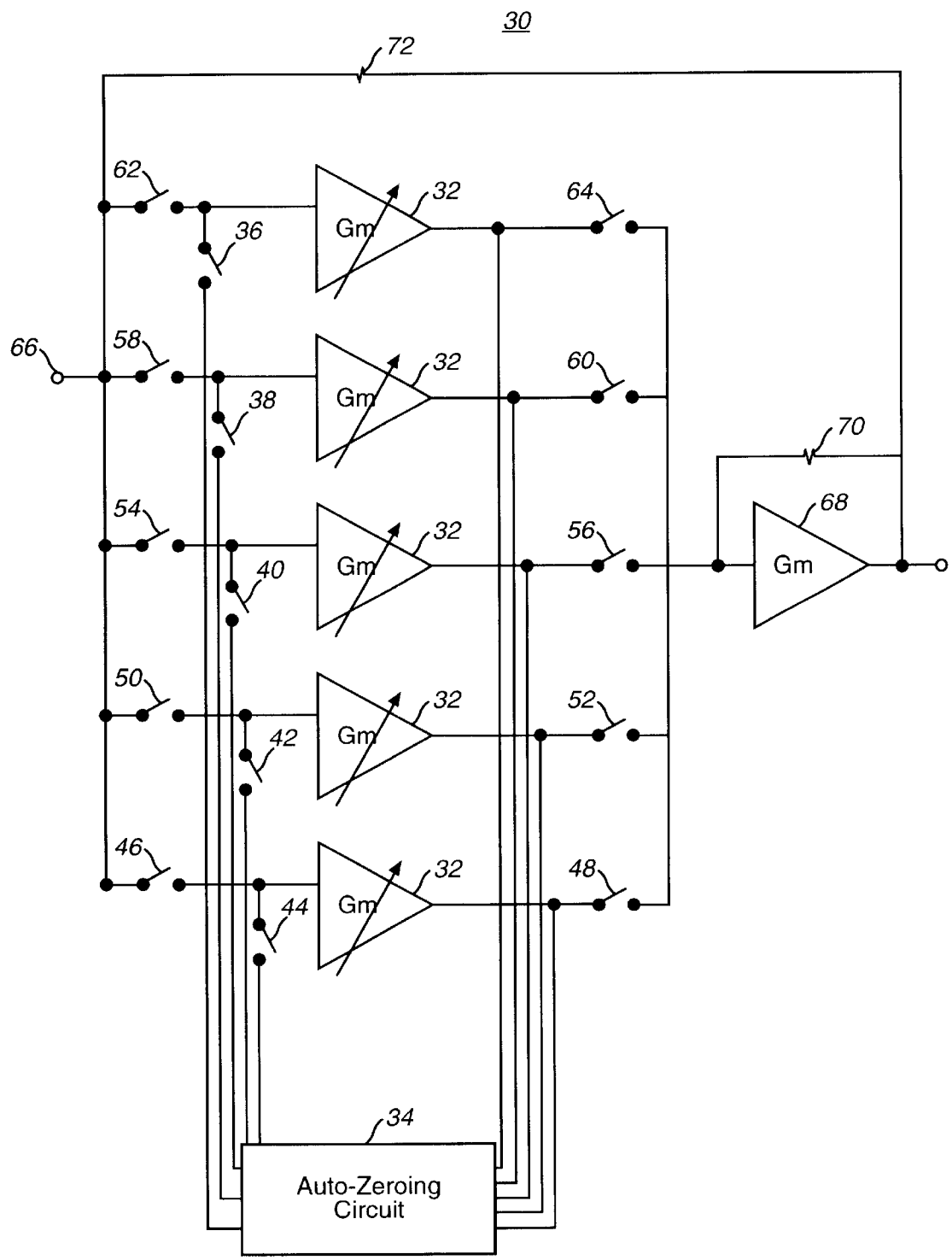
FIG. 2 is schematic diagram of an amplifier circuit having a rotating front end in accordance with one embodiment of the invention.

FIG. 2 is schematic diagram of an amplifier circuit 30 having a rotating front end in accordance with one embodiment of the invention. The amplifier circuit 30 has a plurality of transconductance variable gain stages 32. The plurality of transconductance variable gain stages 32 are connected to an auto-zeroing circuit 34 by a plurality of switches 36, 38, 40, 42, 44. Note that when one of these switches is closed one of the transconductance variable gain stages 32 is connected across the auto-zeroing circuit 34. For instance, when the switch 36 is closed the bottom transcondutance gain stage 32 is connected across the auto-zeroing circuit 34. The auto-zeroing circuit 34 may be a charging capacitor that is charged when the input of the transconductance gain stage is connected to ground.

A plurality of switches 46, 48, 50, 52, 54, 56, 58, 60, 62, 64 are used to connect the plurality of gain stages 32 to the input 66 and the second gain stage 68. The second gain stage 68 has a feedback resistor 70. An overall feedback resistor 72 is connected from the output of the second gain stage 68 to the input 66. In operation four of the transconductance gain stages 32 are connected to the input 66 and the second gain stage 68. The fifth transconductance gain stage (on of the plurality of parallel transconductance gain stages) 32 is connected to the auto-zeroing circuit 34. After a predetermined period of time one of the four transconductance gain stages 32 is connected to the auto-zeroing circuit 34 and the fifth transconductance gain stage is connected to the input. This process is continued so that each of the gain stages is auto-zeroed in turn. This rotating front end allows the all the gain stages to be DC balanced. While the invention is described with five gain stages other embodiments will be apparent to those skilled in the art. In addition, variable gain stages are shown, but the invention encompasses non-variable gain stages.

Figure 3:
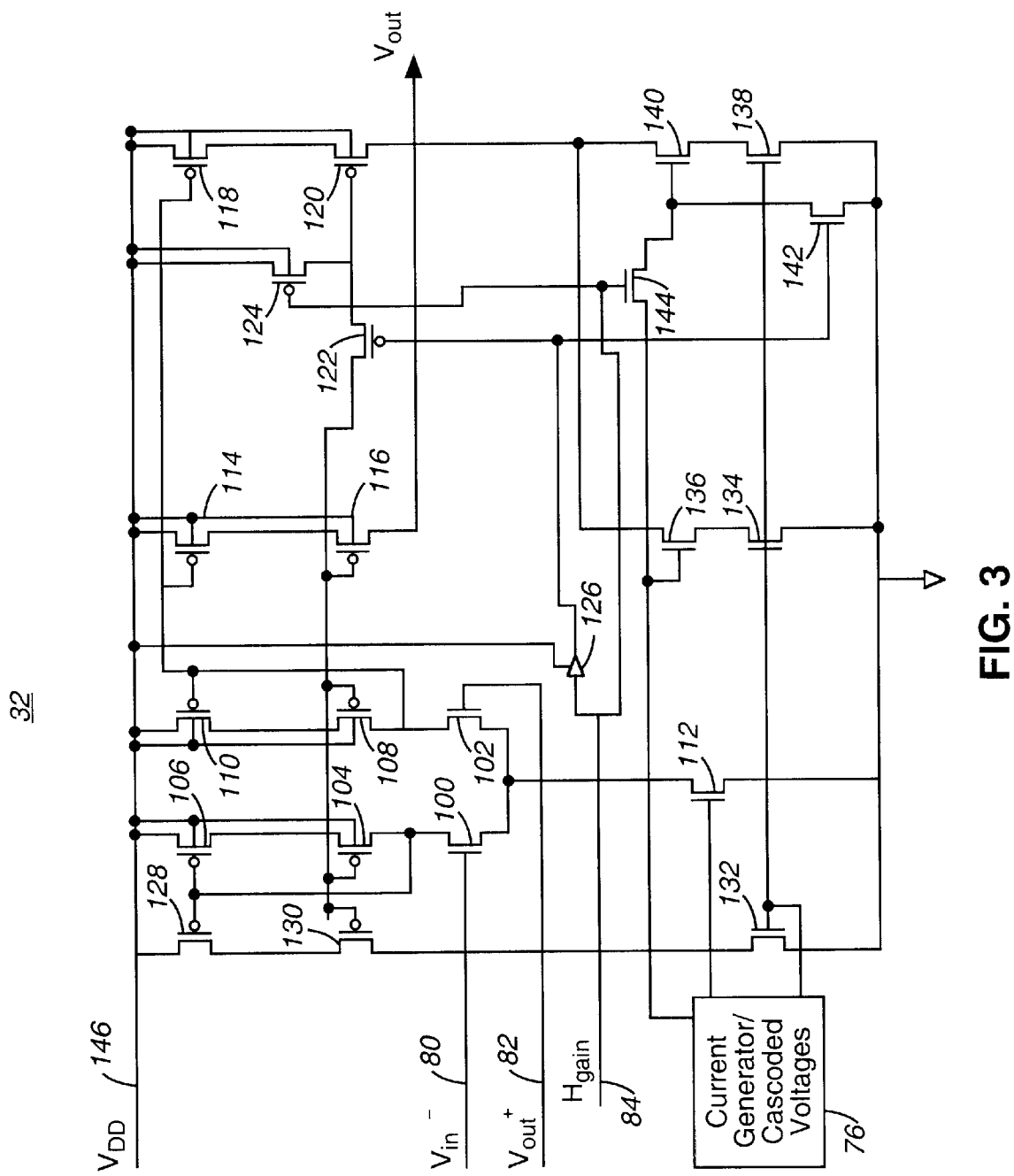
FIG. 3 is schematic diagram of a transconductance gain stage in accordance with one embodiment of the invention.

FIG. 3 is a circuit diagram of a transconductance variable gain stage 32 in accordance with one embodiment of the invention. The inverting input 80 of the transconductance variable gain stage 32 is connected to a first transistor 100. The non-inverting input 82 is connected to a second transistor 102. The first transistor 100 and the second transistor 102 form a differential amplifier. The transistors 104, 106, 108, 110 in combination with the differential amplifier form a cascoded differential amplifier. The current sink is implemented as the transistor 112. The positive current mirror is formed by transistors 114, 116, 118, 120. The gain signal 84 controls transistors (variable gain, positive gain switch) 122, 124. An inverter 126 causes one of the transistors 122, 124 to be open while the other transistor is closed. When transistor 124 is closed, transistor 120 does not draw current as a result the positive current mirror only draws current from transistors 114, 116. When transistor 124 is open and transistor 122 is closed transistor 120 draws current. As a result, the positive current mirror draws current from transistors 114, 116, 118, 120. In one embodiment, the current capacity of transistor 118, 120 is twice the current of transistors 114, 116. As a result the high gain mode draws three times the current of the low gain mode.

The transistors 128, 130, 132 transfer the current from transistors 104, 106 to the negative current mirror. The negative current mirror is formed by transistors 134, 136, 138, 140. The gain switch (negative gain switch) is formed by transistors 142, 144. The negative current mirror works essentially the same as the positive current mirror. The current generator/cascoded voltages circuit 76 powers the current mirrors and various transistors. Power is provided by the input voltage 146.

Figure 4:
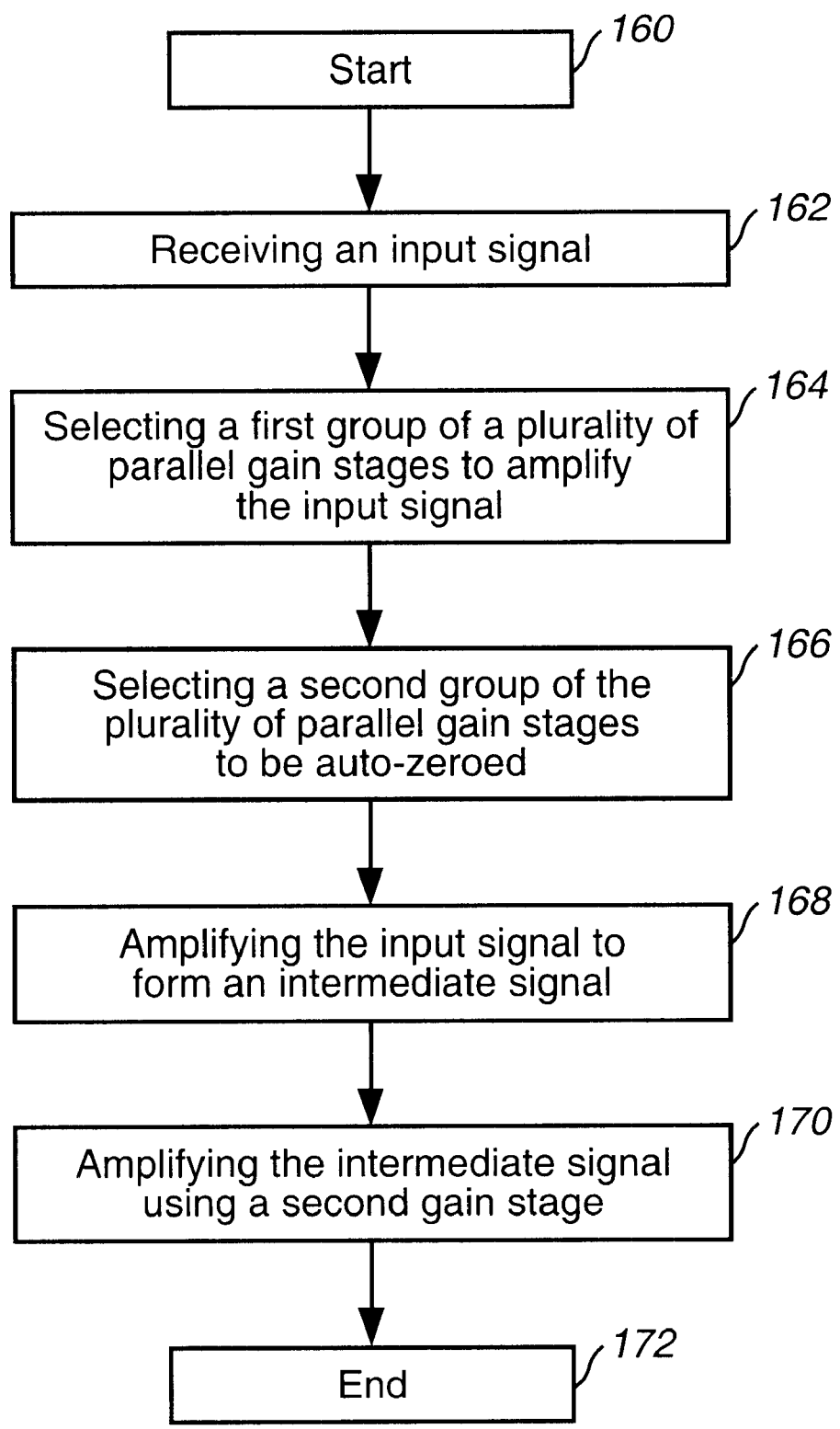
FIG. 4 is a flow chart of the steps used in operating an amplifier circuit having a rotating front end in accordance with one embodiment of the invention.

FIG. 4 is a flow chart of the steps used in operating an amplifier circuit having a rotating front end in accordance with one embodiment of the invention. The process starts, step 160, by receiving an input signal 162. In one embodiment the input signal is an output of a photo-detector. A first group of a plurality of parallel gain stages are selected to amplify the input signal at step 164. A second group of the plurality of gain stages are selected to be auto-zeroed at step 166. The input signal is amplified to form an intermediate signal at step 168. At step 170, the intermediate signal is amplified by second gain stage which ends the process at step 172. In one embodiment when a predetermined period of time has elapsed, one of the first group of the plurality of parallel gain stages is transferred to the second group of the plurality of parallel gain stages. One of the second group of the plurality of parallel gain stages is transferred to the first group of the plurality of parallel gain stages. This provides for the rotation of the gain stages through the auto-zeroing calibration.

In one embodiment, a DC offset for each of the second group of the plurality of parallel gain stages is measured. A correction signal is applied to each of the second group of the plurality of parallel gain stages.

In one embodiment a gain signal is received by the plurality of gain stages. The gain of the plurality of parallel gain stages is adjusted.

In one embodiment, an output of the second gain stage is applied through a feedback resistor to an input of the second gain stage.

Thus there has been described a circuit and a method that provides an amplifier that has large bandwidth, low DC offset and large gain.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A photodetector preamplifier circuit having a "rotating" input stage, comprising:

a switching network connected to an input;

a plurality of parallel transconductance gain stages connected to the switching network;

an auto-zeroing circuit connected to the switching network; and a second transconductance gain stage connected to the plurality of parallel transconductance gain stages, wherein the switching network connects one of the plurality of parallel transconductance gain stages to the auto-zeroing circuit and rotates the connection to the auto-zeroing circuit through each of the plurality of parallel transconductance gain stages.

2. The circuit of claim 1, further including a feedback resistor connected between an input of the second transconductance gain stage and an output of the second transconductance gain stage.

3. The circuit of claim 1, wherein each of the plurality of parallel transconductance gain stages has a variable gain.

4. A method of amplifying a signal, comprising the steps of:
   a) receiving an input signal;
   b) selecting a first group of a plurality of parallel gain stages to amplify the input signal;
   c) selecting a second group of the plurality of parallel gain stages to be auto-zeroed;
   d) amplifying the input signal to form an intermediate signal;
   e) amplifying the intermediate signal using a second gain stage;
   f) when a predetermined period of time has elapsed, transferring one of the first group of the plurality of gain stages to the second group of the plurality of parallel gain stages; and
   g) transferring one of the second group of the plurality of parallel gain stages to the first group of the plurality of parallel gain stages.

5. The method of claim 4, wherein step (c) further includes the steps of:
   c1) measuring a DC offset for each of the second group of the plurality of parallel gain stages;
   c2) applying a correction signal to each of the second group of the plurality of parallel gain stages.

6. The circuit of claim 4, wherein step (b) further includes the step of:
   b1) receiving a gain signal;
   b2) adjusting a gain of the plurality of parallel gain stages.

7. The method of claim 4, further including the step of:
   f) applying an output of the second gain stage through a feedback resistor to an input of the second gain stage.

8. An auto-zeroing photodetector preamplifier circuit, comprising:
   a rotating front end gain stage connected to an input signal;
   an auto-zeroing system connected to the rotating front end gain stage;
   a second gain stage connected to an output of the rotating front end gain stage, wherein the rotating front end gain stage includes:
      a plurality of parallel gain stages; and
      a switching network for connecting one of the plurality of parallel gain stages to the auto-zeroing system and for rotating the connection to the auto-zeroing system through each of the plurality of parallel gain stages.

9. The circuit of claim 8, further including a feedback resistor connected between an input of the second gain stage and an output of the second gain stage.

10. The circuit of claim 8, wherein the plurality of gain stages are each a transconductance gain stage.

11. The circuit of claim 8, wherein the plurality of gain stages are each a variable gain stage.

12. The circuit of claim 8, wherein the second gain stages is a transconductance gain stage.

13. The circuit of claim 8, further including a feedback resistor connected between an input of the rotating front end gain stage and an output of the second gain stage.

14. The circuit of claim 8, further including a feedback resistor connected between inputs of the plurality of parallel transconductance gain stages and an output of the second transconductance gain stage.

* * * * *